(12) United States Patent
Lee et al.

(10) Patent No.: US 11,574,229 B2
(45) Date of Patent: Feb. 7, 2023

(54) THREE-DIMENSIONAL TRANSMON QUBIT APPARATUS

(71) Applicant: Samsung Electronics Co., Ltd., Suwon-si (KR)

(72) Inventors: Jaehyeong Lee, Seoul (KR); Hyeokshin Kwon, Seongnam-si (KR); Insu Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 402 days.

(21) Appl. No.: 16/916,832

(22) Filed: Jun. 30, 2020

(65) Prior Publication Data

US 2021/0216899 A1 Jul. 15, 2021

(30) Foreign Application Priority Data

Jan. 14, 2020 (KR) .......................... 10-2020-0004946

(51) Int. Cl.
*G06N 10/00* (2022.01)
*H01L 27/18* (2006.01)

(52) U.S. Cl.
CPC ............. *G06N 10/00* (2019.01); *H01L 27/18* (2013.01)

(58) Field of Classification Search
CPC ........ G06N 10/00; G06N 10/40; H01L 27/18; H01L 39/045; H01L 39/025; H01L 41/09; H03J 1/06; H03J 1/08

(Continued)

(56) References Cited

U.S. PATENT DOCUMENTS

| 5,949,311 A | 9/1999 | Weiss et al. |
| 9,438,246 B1 | 9/2016 | Naaman |

(Continued)

FOREIGN PATENT DOCUMENTS

| JP | 10-4598 A | 1/1998 |
| KR | 10-2009-0050791 A | 5/2009 |

OTHER PUBLICATIONS

Hanhee Paik et al, "Observation of High Coherence in Josephson Junction Qubits Measured in a Three-Dimensional Circuit QED architecture", Physical Review Letters 107, 240501-1 to 240501-5 (2011) (Year: 2011).*

(Continued)

*Primary Examiner* — Tong-Ho Kim
(74) *Attorney, Agent, or Firm* — NSIP Law

(57) ABSTRACT

Provided is a three-dimensional (3D) transmon qubit apparatus including a body portion, a driver, a transmon element disposed in an internal space of the body portion, a first tunable cavity module disposed in the internal space of the body, and comprising a first superconductive metal panel; and a second tunable cavity module disposed in the internal space of the body, and comprising a second superconductive metal panel, wherein the transmon element is disposed between the first superconductive metal panel and the second superconductive metal panel; wherein the first tunable cavity module and the second tunable cavity module are configured to adjust a distance between the first superconductive metal panel and the second superconductive metal panel, and wherein the driver is configured to tune a resonance frequency by adjusting a 3D cavity by adjusting the distance between the first superconductive metal panel and the second superconductive metal panel.

20 Claims, 16 Drawing Sheets

(58) Field of Classification Search
USPC .......................................................... 706/62
See application file for complete search history.

(56) References Cited

U.S. PATENT DOCUMENTS

| | | |
|---|---|---|
| 10,068,181 B1 | 9/2018 | Rigetti et al. |
| 2007/0232499 A1 | 10/2007 | Ishii et al. |
| 2013/0196855 A1 | 8/2013 | Poletto et al. |
| 2014/0235450 A1 | 8/2014 | Chow et al. |
| 2014/0314419 A1 | 10/2014 | Paik |
| 2016/0079968 A1 | 3/2016 | Strand et al. |
| 2016/0112031 A1 | 4/2016 | Abraham et al. |

OTHER PUBLICATIONS

N.C. Carvalho et al, "Piezoelectric tunable microwave superconducting cavity", Review of Scientific Instruments 87, 094702-1 to 094702-4 (2016) (Year: 2016).*

Chen, Kenle et al., "Antibiased Electrostatic RF MEMS Varactors and Tunable Filters." *IEEE Transactions on Microwave Theory and Techniques*, vol. 58, No. 12, 2010 (pp. 1-12).

Paik, Hanhee et al., "Observation of High Coherence in Josephson Junction Qubits Measured in a Three-Dimensional Circuit QED Architecture." *Physical Review Letters*, 107, No. 24, 2011 (pp. 240501-1-240501-5).

Carvalho, N.C. et al., "Piezoelectric tunable microwave superconducting cavity." *Review of Scientific Instruments*, 87, 2016 (pp. 094702-094702-4).

* cited by examiner

THREE-DIMENSIONAL TRANSMON QUBIT APPARATUS

CROSS-REFERENCE TO RELATED APPLICATION

This application claims the benefit under 35 USC § 119(a) of Korean Patent Application No. 10-2020-0004946, filed on Jan. 14, 2020, in the Korean Intellectual Property Office, the entire disclosure of which is incorporated herein by reference for all purposes.

BACKGROUND

1. Field

The following description relates to a three-dimensional (3D) transmon qubit apparatus.

2. Description of Related Art

Quantum bits, that is, qubits, are used as basic units of information in quantum computing. A qubit may indicate at least two different quantities. The qubit may denote an actual physical device storing information therein, or an information unit that is extracted from a physical device for qubit.

A classical information storage device may generally encode two states classified into labels of "0" and "1." In this example, quantities of encoding bit states follow the laws of classical physics.

Qubits may also include two different physical states classified into labels of "0" and "1." In this example, quantities of encoding the bit states follow the laws of quantum physics. When physical quantities storing these states are mechanically working with quanta, a quantum information storage device may additionally be in a superposition of "0" and "1." Unlike general bits, qubits have amplitudes and phases like waves, and the qubits may be entangled with each other, and thus operation structure of which a type is different from those of general bits may be used. Especially, qubits may be applied to data science and quantum cryptography in addition to quantum chemistry with a quantum mechanical background.

Examples of a quantum system used in a quantum computer may include an optical-based quantum system, a superconductive-based quantum system, an ion trap-based quantum system, and a topological material-based quantum system.

The manufacture of an LC resonator may be achieved by combining a superconductive capacitor and an inductor. Such a superconductive LC resonator may store quantum information, but it may be difficult to control the superconductive LC resonator.

A transmon is a type of superconductive qubit that attenuates the sensitivity of charge noise, and the transmon may decrease the sensitivity regarding charge noise by greatly increasing a ratio of Josephson energy to charge energy. Among superconductive qubits, three-dimensional (3D) transmon qubits may tune qubits or adjust qubit states by adjusting Josephson coupling characteristics of transmons. Signals for tuning have to be electrically controlled to tune superconductive qubits and finely controlled to adjust signals.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a three-dimensional (3D) transmon qubit apparatus including a body portion, a driver, a transmon element disposed in an internal space of the body portion, a first tunable cavity module disposed in the internal space of the body, and comprising a first superconductive metal panel; and a second tunable cavity module disposed in the internal space of the body, and comprising a second superconductive metal panel, wherein the transmon element is disposed between the first superconductive metal panel and the second superconductive metal panel; wherein the first tunable cavity module and the second tunable cavity module are configured to adjust a distance between the first superconductive metal panel and the second superconductive metal panel, and wherein the driver is configured to tune a resonance frequency by adjusting a 3D cavity by adjusting the distance between the first superconductive metal panel and the second superconductive metal panel.

The first tunable cavity module may include a first opposite panel connected to the first superconductive metal panel through a first sliding coupling portion, the second tunable cavity module may include a second opposite panel connected to the second superconductive metal panel through a second sliding coupling portion, the first sliding coupling portion is configured to guide movement of the first superconductive metal panel during adjustment of a distance between the first superconductive metal panel and the first opposite panel, and the second sliding coupling portion is configured to guide movement of the second superconductive metal panel during adjustment of a distance between the second superconductive metal panel and the second opposite panel.

Each of the first and second sliding coupling portions may include a pair of rails that are slidingly inserted into, and coupled to, each other.

The first sliding coupling portion may be provided as a plurality of first sliding coupling portions, and the second sliding coupling portion is provided as a plurality of second sliding coupling portions.

The distance between the first superconductive metal panel and the first opposite panel, and the distance between the second superconductive metal panel and the second opposite panel may be respectively adjusted by the driver, and a distance between the first superconductive metal panel and the second superconductive metal panel is adjusted.

The driver may include a first-length variable rail provided in the first tunable cavity module, and configured to adjust the distance between the first superconductive metal panel and the first opposite panel; and a second-length variable rail provided in second first tunable cavity module, and configured to adjust the distance between the second superconductive metal panel and the second opposite panel.

The first-length variable rail and the second-length variable rail each may include a piezoelectric actuator, and a length of the first-length variable rail and the second-length variable rail is changed based on mechanical deformation caused by electrical energy.

The distance between the first superconductive metal panel and the second superconductive metal panel may be adjusted by a power source.

The driver may include the power source, a first support rail and a second support rail respectively coupled to the first superconductive metal panel and the second superconductive metal panel; and a connection rail structure configured to transmit power between the first support rail and the second support rail, wherein one of the first support rail and the second support rail is directly moved by the power source, and the other of the first support rail and the second support rail is moved by a power from the power source that is transmitted through the connection rail structure.

The first support rail may be disposed between the power source and the first superconductive metal panel, and the first support rail may be configured to move the first superconductive metal panel based on power received from the power source, and the second support rail may be configured to move the second superconductive metal panel based on power transmitted from the power source through the connection rail structure.

The first support rail and the second support rail may each comprise a sawtooth rail, and the connection rail structure comprises a first sawtooth gear and a second sawtooth gear respectively coupled to the sawtooth rail of the first support rail and the sawtooth rail of the second support rail.

The connection rail structure may include a first shaft that is rotatable based on a driving of the first sawtooth gear engaging with the first support rail when the first support rail is moved based on a driving of the power source, a second shaft that is rotatable and connected to the second sawtooth gear coupled to the sawtooth rail of the second support rail; and a transmission shaft having a first end coupled to a first end of the first shaft through a first vertical gear, and a second end coupled to a second end of the second shaft via a second vertical gear.

The first vertical gear and the second vertical gear each include crossed helical gears which rotate in opposite directions to each other.

The second support rail may be located between the power source and the second superconductive metal panel, and is configured to move the second superconductive metal panel based on power received from the power source, and the first support rail is configured to move the first superconductive metal panel based on power transmitted from the power source through the connection rail structure.

The first support rail and the second support rail may each include a sawtooth rail, and the connection rail structure may include a first sawtooth gear and a second sawtooth gear respectively coupled to the sawtooth rail of the first support rail and the second support rail.

The connection rail structure may include a first shaft that is rotatable by driving of the second sawtooth gear engaging with the second support rail when the second support rail is moved by a driving of the power source; a second shaft that is rotatable and connected to the first sawtooth gear coupled to the sawtooth rail of the first support rail; and a transmission shaft having a first end coupled to a first end of the first shaft via a first vertical gear, and a second end coupled to a second end of the second shaft via a second vertical gear.

The first vertical gear and the second vertical gear may each include crossed helical gears which rotate in opposite directions to each other.

The first opposite panel and the second opposite panel may be respectively disposed on a first end and a second end of the body portion.

A distance between the first opposite panel and the second opposite panel may be constant.

The transmon element may be located at a same distance from the first superconductive metal panel and the second superconductive metal panel.

Other features and aspects will be apparent from the following detailed description, the drawings, and the claims.

Figure 1:
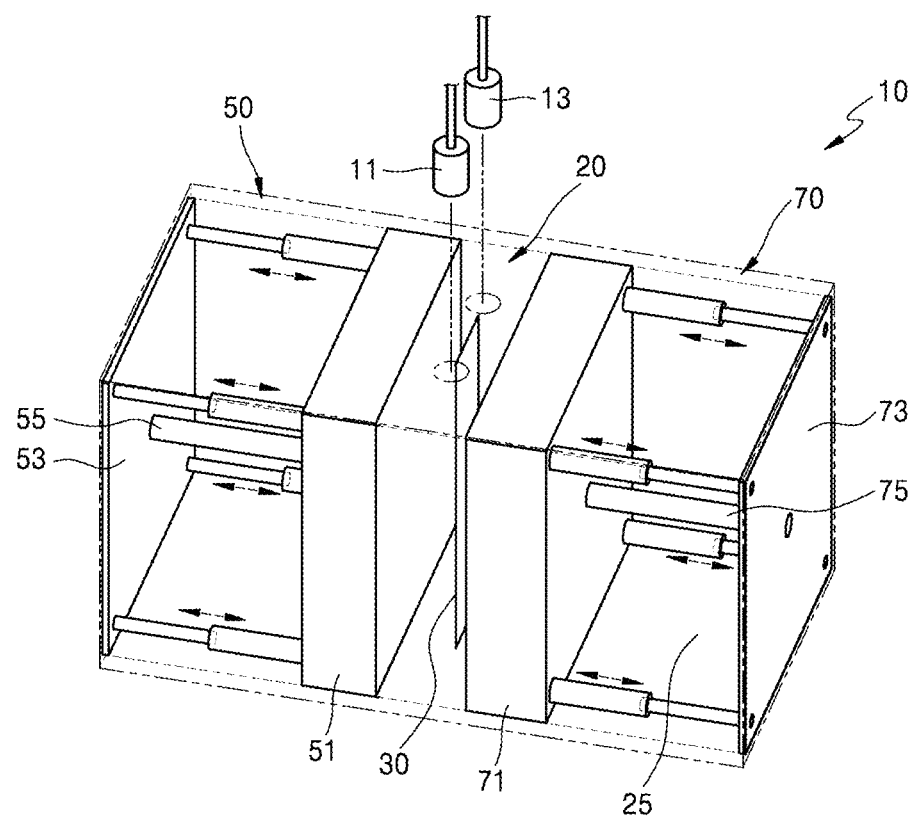
FIG. 1 illustrates an example three-dimensional (3D) transmon qubit apparatus, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

It will be understood that when a layer, region, or component is referred to as being "formed on" another layer, region, or component, it can be directly or indirectly formed on the other layer, region, or component. It will be understood that although the terms "first," "second," etc. may be used herein to describe various components, these components should not be limited by these terms. These components are only used to distinguish one component from another. Such terms do not limit that materials or structures of components are different. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. The use of the terms "a" and "an" and "the" and similar referents in the context of describing the disclosure are to be construed to cover both the singular and the plural.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

An LC resonator may be manufactured by combining a superconductive capacitor and an inductor. Such a superconductive LC resonator may store quantum information, but it may not be implemented to control the superconductive LC resonator.

A transmon is a type of superconductive charge qubit that attenuates the sensitivity of charge noise. To reduce the sensitivity of charge noise while maintaining the sufficient nonuniformity to selectively control the qubits, two superconductors may be configured as a Cooper-pair box classified according to the capacity.

To form three-dimensional (3D) transmon qubits, a 3D cavity that is an area where radio frequency (rf) signals are transmitted may be implemented and applied by estimating a resonance frequency band necessary for qubit operation.

The 3D transmon qubit apparatus according to an embodiment, may form a superconductive 3D transmon used in quantum computing, and apply thereto a 3D cavity, which is an rf signal transmission medium, and the 3D transmon qubit apparatus is prepared to adjust a resonance frequency regarding an rf signal transmitted to a superconductive qubit with the 3D cavity.

Among the superconductive qubits, a 3D transmon qubit includes a 3D cavity and a transmon element, and the 3D cavity and the transmon element may be located inside the 3D transmon qubit apparatus. In an example, the 3D transmon qubit apparatus may adjust a qubit state by tuning a qubit in response to an rf signal or adjusting Josephson coupling characteristics of a transmon in response to an electrical signal using a separate gate line and may be configured to operate by adjusting the qubit state. To tune the superconductive qubit, signals for tuning have to be electrically controlled and finely controlled to adjust signals. According to the 3D transmon qubit apparatus according to an embodiment, the 3D cavity may be finely adjusted by applying the tunable cavity, and thus signals for tuning the superconductive qubits may be finely controlled.

Figure 2:
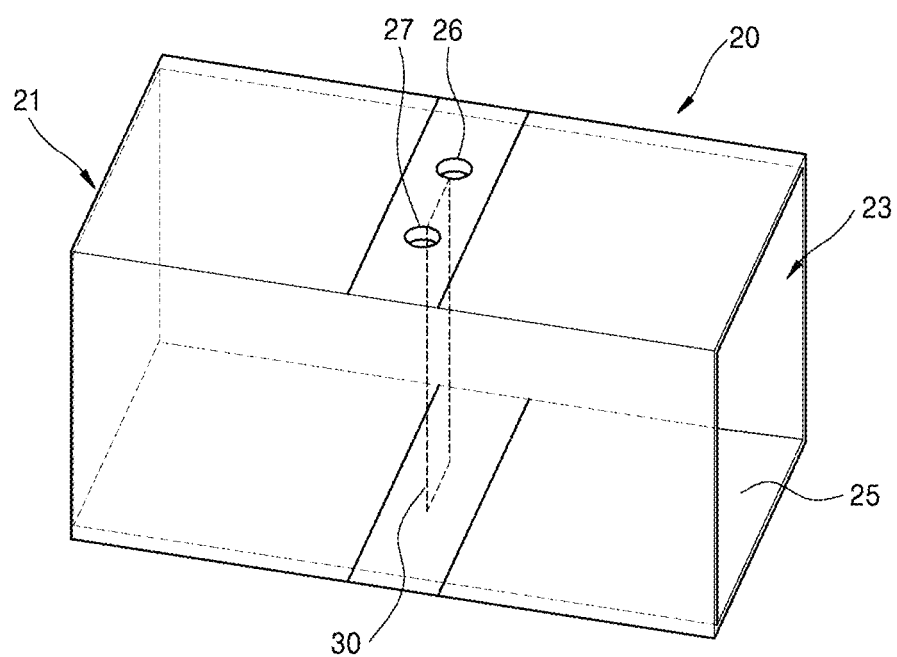
FIG. 2 illustrates a body portion of an example 3D transmon qubit apparatus, in accordance with one or more embodiments.
Figure 3:
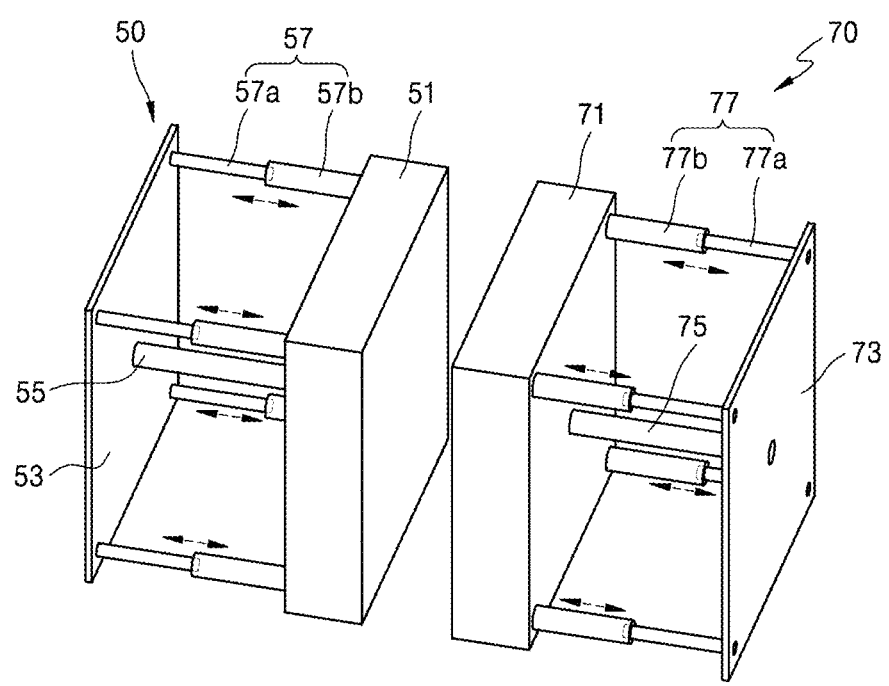
FIG. 3 illustrates a perspective view of a first tunable cavity module and a second tunable cavity module of an example 3D transmon qubit apparatus, in accordance with one or more embodiments.

FIG. 1 illustrates a 3D transmon qubit apparatus 10, in accordance with one or more embodiments. FIG. 2 illustrates a body portion 20 of FIG. 1, in accordance with one or more embodiments. FIG. 3 illustrates first and second tunable cavities 50 and 70 installed in the body portion 20 of FIG. 1.

Referring to FIGS. 1 to 3, the 3D transmon qubit apparatus 10 according to an example may include: the body portion 20 which has an internal space 25, and of which both ends are open; a transmon element 30 disposed inside the body portion 20; the tunable cavity installed inside the open body portion 20; and a driver which tunes a resonance frequency by driving the tunable cavity. The tunable cavity includes first and second superconductive metal panels 51 and 71, and adjusts a distance between the first and second superconductive panels 51 and 71 with the transmon element 30 therebetween.

The body portion 20 has a structure of which at least both ends are open and has the internal space 25 for housing the transmon element 30 and the tunable cavity. The body portion 20 may be formed of a superconductive metal box. For example, the body portion 20 may be formed of a superconductive metal box including, as a non-limiting example, aluminum (Al), or may be formed of a box type including other various superconductive metal materials. The body portion 20 may include a connector cavity for holding the transmon element 30 and the tunable cavity including the first and second superconductive metal panels 51 and 71.

Referring to FIG. 2, the internal space 25 of the body portion 20 may be surrounded by at least four facets. Connector coupling holes 26 and 27 may, for example, input/output an rf signal, and may be formed on at least one of the at least four facets surrounding the body portion 20 to form the internal space 25.

FIGS. 1 and 2 illustrate an example in which the connector coupling holes 26 and 27 are formed in an upper surface of the body portion 20. However, this is only an example, and the holes 26 and 27 may be formed on other portions of the body portion 20. FIGS. 1 and 2 and FIGS. 5A and 5B illustrating the operation show an example in which two holes 26 and 27 for coupling a connector 13 for inputting an rf signal and a connector 11 for outputting an rf signal are formed. Shapes and the number of the holes 26 and 27 may vary according to shapes and configurations of connectors. The connector 13 for inputting the rf signal and the connector 11 for outputting the rf signal may be electrically connected to the transmon element 30.

In an example, the transmon element 30 may be fixed inside the body portion 20. The transmon element 30 may be disposed between the first and second superconductive metal panels 51 and 71 of the tunable cavity. The transmon element 30 may be installed to be placed between the first and second superconductive metal panels 51 and 71. Resonance frequency tuning of the 3D transmon qubit apparatus 10 may be performed by adjusting the distance between the first and second superconductive metal panels 51 and 71.

FIGS. 1 and 3 and FIGS. 5A and 5B illustrating the operation show an example of a structure of the tunable cavity for adjusting the distance between the first and second superconductive metal panels 51 and 71 with the driver.

In the present embodiment, the tunable cavity may include the first tunable cavity module 50 including the first superconductive metal panel 51 and the second tunable cavity module 70 including the second superconductive metal panel 71.

Figure 4:
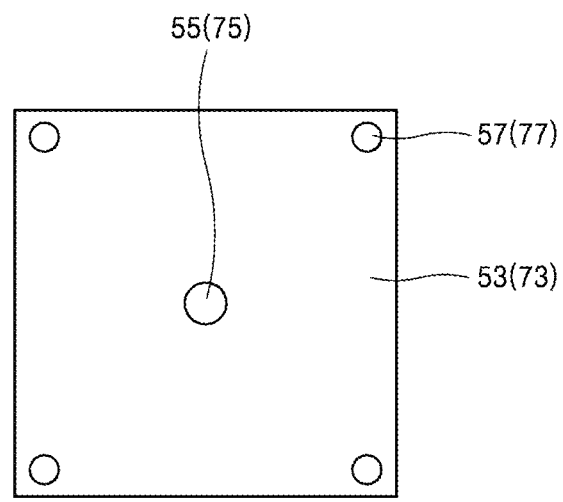
FIG. 4 illustrates a side view of an example 3D transmon qubit apparatus, in accordance with one or more embodiments.

FIG. 3 is a perspective view illustrating the first and second tunable cavity modules 50 and 70. FIG. 4 illustrates a side view of FIG. 1.

Referring to FIGS. 3 and 4, the first tunable cavity module 50 may include a first opposite panel 53 connected to the first superconductive metal panel 51 by a first sliding coupling portion 57. The first sliding coupling portion 57 may guide a movement of the first superconductive metal panel 51 during an adjustment of a distance between the first superconductive metal panel 51 and the first opposite panel 53. In an example, the first sliding coupling portion 57 may include a pair of rails 57a and 57b that are slidingly inserted and coupled to each other, an end of the rail 57b may be coupled to the first superconductive metal panel 51, and an end of the other rail 57a may be coupled to the first opposite panel 53. Corresponding to the adjustment of the distance between the first superconductive metal panel 51 and the first opposite panel 53 by a driver, for example, a first-length variable rail 55, a length of the pair of rails 57a and 57b forming the first sliding coupling portion 57, and slidingly inserted into each other, is adjusted, and thus the entire length of the first sliding coupling portion 57 may be changed.

The second tunable cavity module 70 may include a second opposite panel 73 connected to the second superconductive metal panel 71 by a second sliding coupling portion 77. The second sliding coupling portion 77 may guide a movement of the second superconductive metal panel 71 when adjusting a distance between the second superconductive metal panel 71 and the second opposite panel 73. In an example, the second sliding coupling portion 77 may include a pair of rails 77a and 77b, which are slidingly inserted into, and coupled to, each other, and an end of the rail 77b may be coupled to the second superconductive metal panel 71, and an end of the rail 77a may be coupled to the second opposite panel 73. Corresponding to the adjustment of the distance between the second superconductive metal panel 71 and the second opposite panel 73 by the driver, for example, the second-length variable rail 75, a length of the pair of rails 77a and 77b forming the second sliding coupling portion 77 and slidingly inserted into each other, is adjusted, and thus the entire length of the second sliding coupling portion 77 may be changed.

FIGS. 1 to 4 illustrate an example in which the first and second sliding coupling portions 57 and 77 support distance-variable connections between the first superconductive metal panel 51 and the first opposite panel 53, and between the second superconductive metal panel 71 and the second opposite panel 73, at four locations in a balanced manner. However, the number and locations of the first and second sliding coupling portions 57 and 77 may vary.

Additionally, FIGS. 1 to 4 illustrate an example in which the first sliding coupling portion 57 and the second sliding coupling portion 77 have structures in which the rails are slidingly inserted into, and coupled to, each other, and the structures of the first and second sliding coupling portions 57 and 77 may vary.

In the example, the driver may include a first driver, for example, a first-length variable rail 55, which adjusts the distance between the first superconductive metal panel 51 and the first opposite panel 53, and a second driver, for example, a second-length variable rail 75, which adjusts the distance between the second superconductive metal panel 71 and the second opposite panel 73, thus adjusting the distance between the first and second superconductive metal panels 51 and 71 forming the tunable cavity. The first opposite panel 53 and the second opposite panel 73 are respectively fixed to the open ends 21 and 23 of the body portion 20, and when the distance between the first superconductive metal panel 51 and the first opposite panel 53 and the distance between the second superconductive metal panel 71 and the second opposite panel 73 may be respectively adjusted due to the operation of the first-length variable rail 55 and the second-length variable rail 75 forming the first and second drivers, the distance between the first and second superconductive metal panels 51 and 71 may be adjusted.

Accordingly, the first-length variable rail 55 constituting the first driver may be provided in the first tunable cavity module 50 and coupled between the first superconductive metal panel 51 and the first opposite panel 53, thus adjusting the distance between the first superconductive metal panel 51 and the first opposite panel 53. The second-length variable rail 75 constituting the second driver is provided in the second tunable cavity module 70 and coupled between the second superconductive metal panel 71 and the second opposite panel 73, thus adjusting the distance between the second superconductive metal panel 71 and the second opposite panel 73. The first-length variable rail 55 and the second-length variable rail 75 may be mechanically deformed due to electrical energy supplied from a power source, and thus their lengths may change. In an example, the first-length variable rail 55 and the second-length variable rail 75 may include piezo-electric actuators. The first-length variable rail 55 and the second-length variable rail 75 may receive electrical energy from one power source or respective power sources.

In two examples where the first-length variable rail 55 and the second-length variable rail 75 receive electrical energy from one power source or respective power sources, the 3D transmon qubit apparatus 10 according to an example, may adjust the distance between the first and second superconductive metal panels 51 and 71 by driving of each of the first-length variable rail 55 and the second-length variable rail 75, and thus for example, it may correspond to the application of two power sources.

The present embodiment is merely an example in which the first driver includes one first-length variable rail 55, and the second driver includes one second-length variable driver 75. However, the number of length variable rails may vary based on the examples.

For safe adjustment of the distance between the first and second superconductive metal panels 51 and 71, the first-length variable rail 55 may be disposed at the center of an arrangement of a plurality of first sliding coupling portions 57, and the second-length variable rail 75 may be disposed at the center of an arrangement of a plurality of second sliding coupling portions 77. Additionally, in an example, the first-length variable rail 55 and the second-length variable rail 75 may be disposed on the same axis. Likewise, as the first-length variable rail 55 and the second-length variable rail 75 are disposed at the center of the tunable cavity on the same axis, the adjustment of the distance between the first and second superconductive metal panels 51 and 71 may be safely performed by adjusting the distance between the first superconductive metal panel 51 and the first opposite panel 53, and adjusting the distance between the second superconductive metal panel 71 and the second opposite panel 73.

Referring to FIG. 3, the first superconductive metal panel 51 and the first opposite panel 53 of the first tunable cavity module 50, and for example, four first sliding coupling portions 57 therebetween, and the first-length variable rail 55 constituting the first driver may form a module. The second superconductive metal panel 71 and the second opposite panel 73 of the second tunable cavity module 70, and for example, four second sliding coupling portions 77 therebetween, and the second-length variable rail 75 constituting the second driver may form a module.

Examples in which the first tunable cavity module 50 includes four first sliding coupling portions 57 and the first-length variable rail 55 and the second tunable cavity module 70 includes four second sliding coupling portions 77 and the second-length variable rail 75 are disclosed. However, the number of sliding coupling portions and length variable rails may vary.

The first tunable cavity module 50 including the first-length variable rail 55 and the second tunable cavity module 70 including the second-length variable rail 75 may be inserted and installed through the respective open ends of the body portion 20 shown in FIG. 2. For example, while the transmon element 30 is disposed in the internal space 25 of the body portion 20, the first tunable cavity module 50 may be inserted and installed in the internal space 25 of the body portion 20 through the open end, for example, a left end 21, and the second tunable cavity module 70 may be inserted and installed in the internal space 25 of the body portion 20 through the open end, for example, a right end 23. In this example, the transmon element 30 may be disposed between the first and second superconductive metal panel 51 and 71 of the tunable cavity.

In this example, the first and second opposite panels 53 and 73 may respectively be disposed on both ends of the body portions 20, and a distance between the respective first and second opposite panels 53 and 73 may be constant. Additionally, in a non-limiting example, the transmon element 30 may be a same distance from the first and second superconductive metal panels 51 and 71.

Figure 5A:
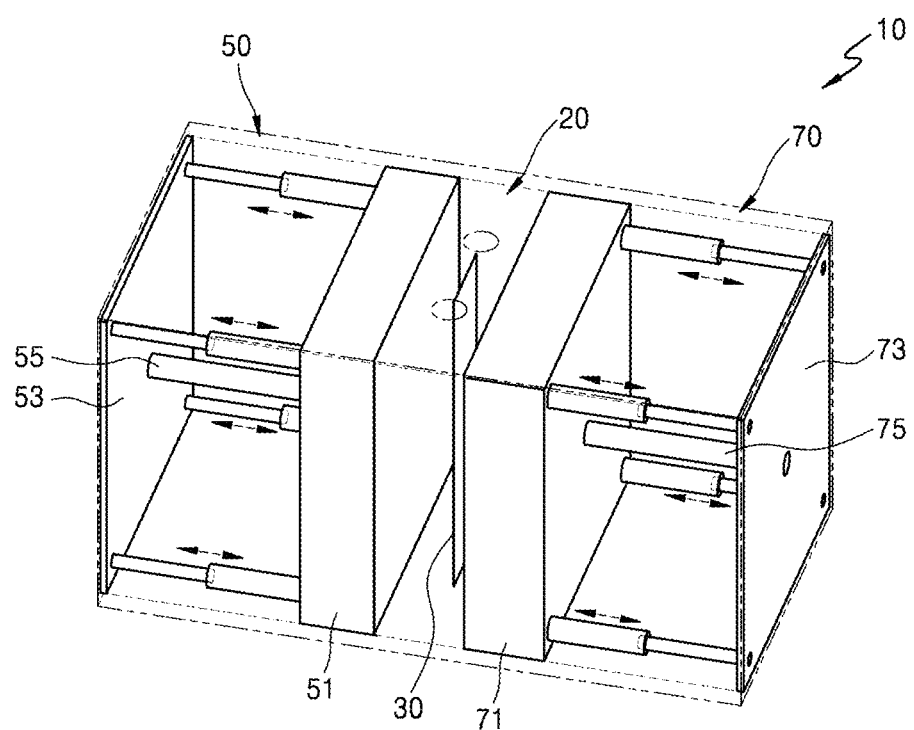
FIGS. 5A and 5B illustrates an example of a configuration of a tunable cavity that adjusts a distance between first and second superconductive metal panels by means of a driver, in accordance with one or more embodiments.
Figure 5B:
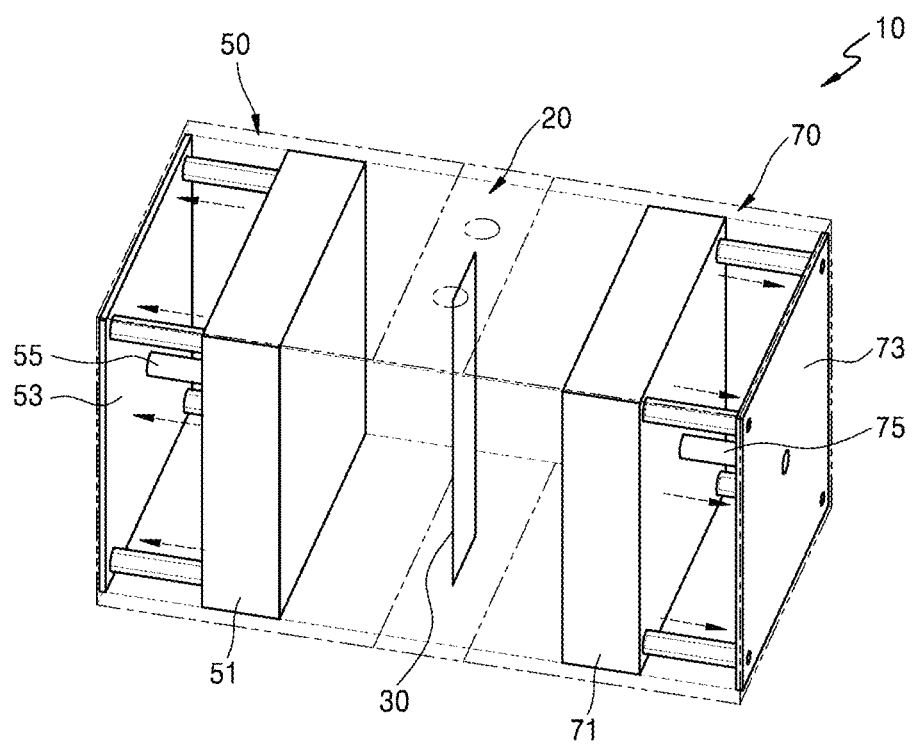

FIGS. 5A and 5B illustrate an operation example of the 3D transmon qubit apparatus 10, in accordance with one or more embodiments. FIG. 5A illustrates a state in which the transmon element 30 is adjusted to be close between the first superconductive metal panel 51 and the second superconductive metal panel 71. FIG. 5B shows a state adjusted to be far away between the first superconductive metal panel 51 and the second superconductive metal panel 71.

Referring to FIGS. 5A and 5B, the distance between the first superconductive metal panel 51 and the first opposite panel 53, and the distance between the second superconductive metal panel 71 and the second opposite panel 73 may be adjusted by driving the first-length variable rail 55 and driving the second-length variable rail 75, respectively, to adjust the distance between the first and second superconductive metal panels 51 and 71, and accordingly a length of a resonator of the tunable cavity and an effective size of the internal space 25 of the body portion 20 may be adjusted, thereby tuning a resonance frequency of the 3D transmon qubit apparatus 10.

In an example, the distance between the first superconductive metal panel 51 and the first opposite panel 53, and the distance between the second superconductive metal panel 71 and the second opposite panel 73 may be simultaneously adjusted. In another example, the distance between the first superconductive metal panel 51 and the first opposite panel 53, and the distance between the second superconductive metal panel 71 and the second opposite panel 73 may differ from each other.

As described above, as the distance between the first superconductive metal panel 51 and the first opposite panel 53, and the distance between the second superconductive metal panel 71 and the second opposite panel 73 are adjusted by driving the first-length variable rail 55 and the second-length variable rail 75, the distance between the first and second superconductive metal panels 51 and 71 may be adjusted in the internal space 25 of the body portion 20, and the effective size of the internal space 25 of the body portion 20, that is, the 3D cavity, may be adjusted, thereby tuning the resonance frequency of the 3D transmon qubit apparatus 10.

In the 3D transmon qubit apparatus 10 according to the examples, the tunable cavity and the body portion 20 may be configured to form the cavity for the transmon element 30, and the range of the tuned resonance frequency may have a value covering the frequency range of the transmon and the tuning of the resonance frequency may be performed within a range from about 4 to about 20 GHz that covers the resonance frequency. Also, according to the 3D transmon qubit apparatus 10 according to the examples, since the locations of the first and second superconductive metal panels 51 and 71 may be separately adjusted, noise in the rf signals may be minimized by increasing a Q-factor through the prediction of the location where the resonance mode occurs.

As described above, in the 3D transmon qubit apparatus 100 according to an example, the 3D tunable cavity and the transmon element 30 may be disposed inside the body portion 120, and the resonance frequency to the rf signals transmitted to superconductive qubits may be adjusted, thereby controlling the qubit characteristics through a location, where the resonance mode occurs, and a frequency tuning. According to the 3D transmon qubit apparatus 10, the size of the 3D cavity may be adjusted to enable the tuning to fit with a Josephson coupling energy region in a region of between about 4 and about 20 GHz.

That is, the tunable cavity and the body portion 20 may be configured to form a cavity for one transmon 30 by holding the tunable cavity including the first tunable cavity module 50 and the second tunable cavity module 70 in the internal space 25 of the body portion 20, and a tuning range may have a value covering a frequency range of the transmon element 30, for example, a resonance frequency ranging from about 4 to about 20 GHz.

In this example, a location, where the resonance mode occurs, may be predicted by respectively adjusting the locations of the first superconductive metal panel 51 and the second superconductive metal panel 71 in the first tunable cavity module 50 and the second tunable cavity module 70, to increase a Q-factor, and noise in the rf signals may be minimized, thereby improving the qubit control performance.

An example where the 3D transmon qubit apparatus 10 uses power sources used to respectively adjust the first superconductive metal panel 51 and the second superconductive metal panel 71 constituting the tunable cavity has been described as an example, but the examples are not limited thereto. The 3D transmon qubit apparatus according to an embodiment may adjust the distance between the first superconductive metal panel 51 and the second superconductive metal panel 71 constituting the tunable cavity by using one power source.

Figure 6:
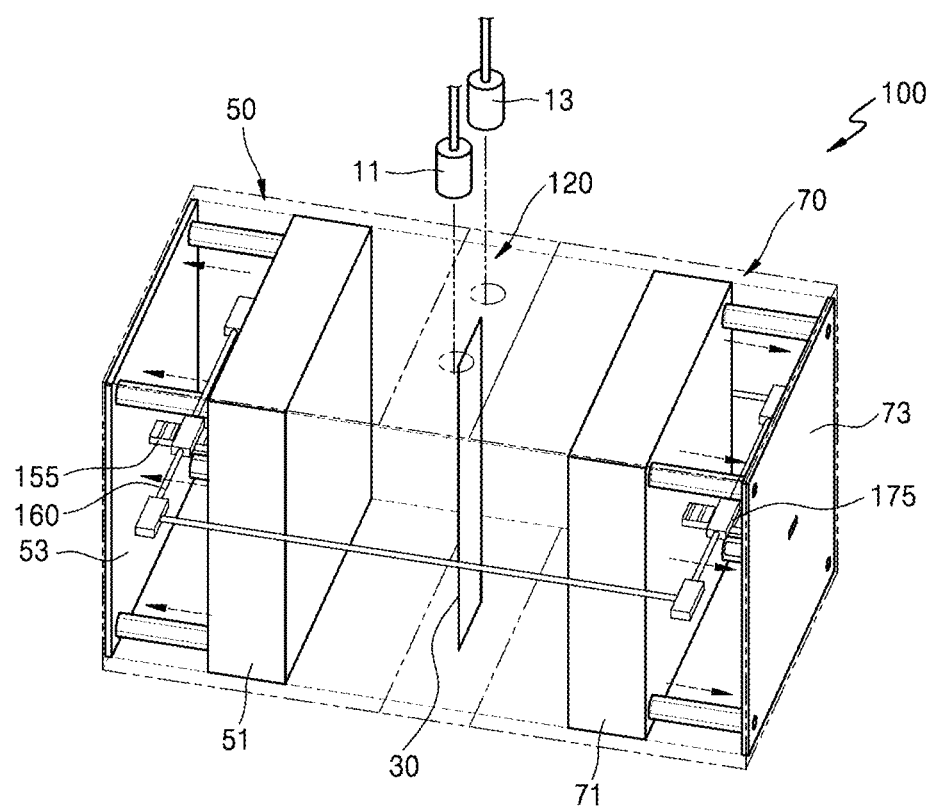
FIG. 6 illustrates an example 3D transmon qubit apparatus, in accordance with one or more embodiments.
Figure 7:
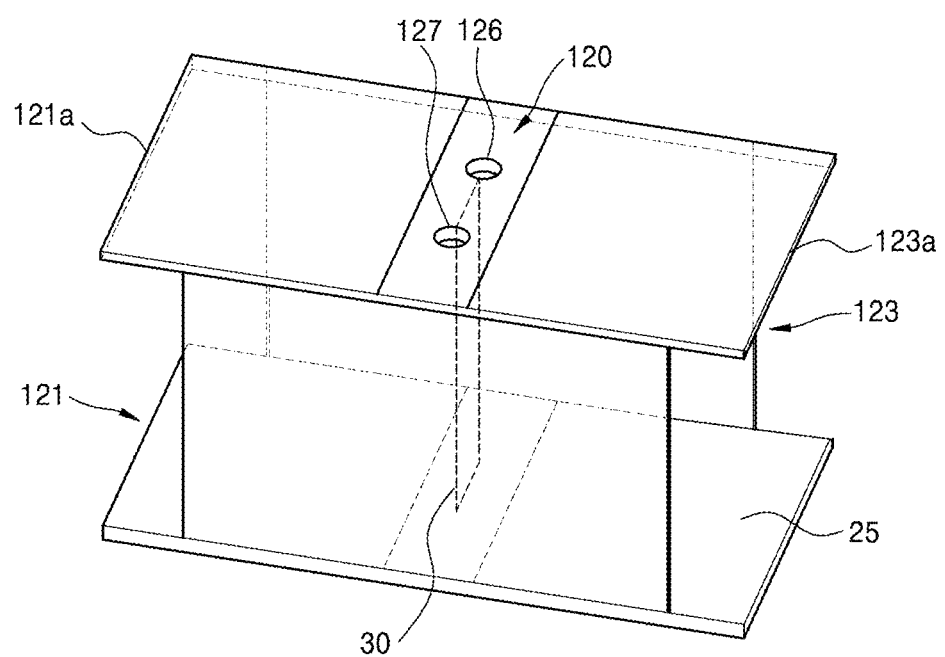
FIG. 7 illustrates an example body portion of a 3D transmon qubit apparatus, in accordance with one or more embodiments.

FIG. 6 illustrates a 3D transmon qubit apparatus 100 according, in accordance with one or more embodiments. FIG. 7 illustrates a body portion 120 of FIG. 6. The 3D transmon qubit apparatus 100 according to the present example differs from the 3D transmon qubit apparatus 10 according to the examples of FIGS. 1 to 3 in terms of the configuration of the driver that tunes the resonance frequency by driving the tunable cavity, as well as in the shape of the body portion 120 that enables the implementation of the driver. Substantially the same configurations as the 3D transmon qubit apparatus 10 are denoted by the same reference numerals, and repeated descriptions are omitted as much as possible.

In the present example, the driver has a structure in which, as a non-limiting example, one power source may be used to adjust the distance between the first and second superconductive metal panels 51 and 71, and may include the first and second support rails 155 and 175, which may be respectively coupled to the first and second superconductive metal panels 51 and 71, and a connection rail structure 160 for transmitting power from the power source to the first support rail 155. The second support rail 175 may be directly moved by the power source, and the power from the power source may be transmitted to the first support rail 155 by the connection rail structure 160. Here, an example where the second support rail 175 is directly moved by the power source and the power from the power source is transmitted to the first support rail 155 by the connection rail structure 160 is described as an example. The 3D transmon qubit apparatus 100 according to an example may be configured so that the first support rail 165 may be directly moved by the power source, and the power from the power source may be transmitted to the second support rail 175 by the connection rail structure 160. Hereinafter, an example where the second support rail 175 may be directly moved by the power source and the power from the power source may be transmitted to the first support rail 155 by the connection rial structure 160 is described.

In the present example, the tunable cavity may be implemented by the first tunable cavity module 50 including the first superconductive metal panel 51 and the second tunable cavity module 70 including the second superconductive metal panel 71. That is, the first tunable cavity module 50 may include the first opposite panel 53 connected to the first superconductive metal panel 51 through the first sliding coupling portion 57. The second tunable cavity module 70 may include the second opposite panel 73 connected to the second superconductive metal panel 71 through the second sliding coupling portion 77. In this example, the first sliding coupling portion 57 may guide the movement of the first superconductive metal panel 51 when the first support rail 155 is moved according to the power transmitted through the connection rail structure 160. The second sliding coupling portion 77 may guide the movement of the second superconductive metal panel 71 when the second support rail 175 is moved.

In this example, the first and second opposite panels 53 and 73 may be disposed on both ends of the body portion 120, and the distance between the first and second opposite panels 53 and 73 may be constant. Additionally, the transmon elements 30 may be disposed at the same distance from the first and second superconductive metal panels 51 and 71.

In the present example, the first sliding coupling portion 57, the second sliding coupling portion 77, the first opposite panel 53, the second opposite panel 73, and the like may not be formed.

In the present example, the body portion 120 may have a structure in which both ends 121 and 123 are open, have the internal space 25 to contain the transmon element 30 and the tunable cavity, and may be formed of a superconductive metal box, similar to the body portion 20 described above. In a non-limiting example, the body portion 120 may be formed of a superconductive metal box including aluminum (Al), or may be formed of a box type including various superconductive metallic materials.

The body portion 120 may constitute a connector cavity for holding the tunable cavity including the transmon element 30 and the first and second superconductive metal panels 51 and 71, and a structure in which the first support rail 165 may be directly moved by the power source and the power from the power source is transmitted to the second support rail 175 through the connection rail structure 160.

Referring to FIG. 7, the internal space 25 of the body portion 120 may be formed by a structure surrounded by at least four facets. In at least one of the at least four facets that form the internal space 25 of the body portion 120, for example, connector coupling holes 126 and 127 for inputting/outputting the rf signals may be formed. FIGS. 6 and 7 illustrate an example in which the connector coupling holes 126 and 127 are formed in an upper surface of the body portion 120. FIGS. 6 and 7 and FIGS. 10A and 10B, illustrating the operation, illustrate examples in which two holes 126 and 127 for coupling the connector 13 that inputs the rf signal and the connector 11 that outputs the rf signal are formed. The type of shape and the number of holes may vary according to shapes and configurations of connectors. The connector 13 that outputs the rf signal, and the connector 11 that outputs the rf signal may be electrically connected to the transmon element 30.

In the present example, the body portion 120 may be formed to have both ends of, for example, a structure in which front and rear surfaces are drawn compared to upper and lower surfaces, so that the connection rail structure 160 of the driver is installed on the body portion 120. In FIG. 7, reference numerals 121a and 123a denote protruding portions of the upper and lower surfaces compared to the front and rear surfaces, in the both ends 121 and 123 of the body portion 120.

Figure 8:
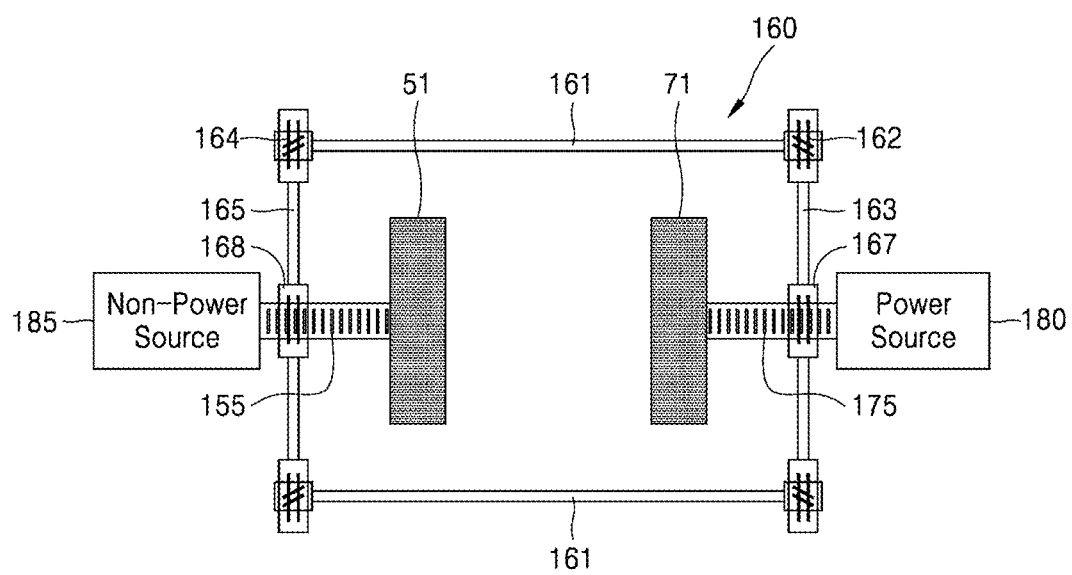
FIG. 8 illustrates an example of a driver using one power source applicable to an example 3D transmon qubit apparatus, in accordance with one or more embodiments.

FIG. 8 illustrates an example of a driver using one power source 180 applicable to the 3D transmon qubit apparatus 100 of FIG. 6. FIG. 8 illustrates an example in which a power source 180 is connected to the second support rail 175, and a non-power source 185 is connected to the first support rail 155 in an opposite direction. In a non-limiting example, the power source 180 may be connected to the first support rail 155, and the non-power source 185 may be connected to the second support rail 175.

Referring to FIG. 8, in a non-limiting example, the first and second support rails 155 and 175 may be formed in a sawtooth rail form. The second support rail 175 may be moved by, for example, the power source 180, and thus may adjust the location of the second superconductive metal panel 751. The connection rail structure 160 may include: a first shaft 163 that is coupled to a sawtooth rail of the second support rail 175 by a saw-tooth gear 167, and may be rotatable by the operation of the sawtooth gear 167 engaged with the saw-tooth rail of the second support rail 175 as the sawtooth rail of the second support rail 175 is moved by the driving of the power source 180; a second shaft 165 that is rotatably coupled to the sawtooth rail of the first support rail 155 by a sawtooth gear 168; and transmission shafts 161 each having an end coupled to an end of the first shaft 163 by a first vertical gear 162 and other end coupled to an end of the second shaft 165 by a second vertical gear 164. The first shaft 163 may be provided symmetrically on both sides of the sawtooth gear 167. The second shaft 165 may be provided symmetrically on both sides of the sawtooth gear 168.

In an example, a pair of transmission shafts 161 may be provided. The pair of transmission shafts 161 may be coupled to the pair of first shafts 163, which are symmetrically provided on both ends of the sawtooth gear 167, by the first vertical gear 162, and may be coupled to the pair of second shafts 165, which are symmetrically provided on both ends of the sawtooth gear 168, by the second vertical gear 164, thereby connecting between the pair of first shafts 163 and the pair of second shafts 165.

In this example, the first and second vertical gears 162 and 164 may be crossed helical gears which rotate in opposite directions to each other to rotate the second shaft 165 in an opposite direction to the first shaft 163, so that the movement of the second support rail 175 may be transmitted to the connection rail structure 160 through the sawtooth gear 167, and the first support rail 155 of the sawtooth rail type may be moved in an opposite direction to the movement of the second support rail 175 through the sawtooth gear 168 according to the operation of the connection rail structure 160, thereby adjusting the distance between the respective first and second superconductive metal panels 51 and 71.

Figure 9:
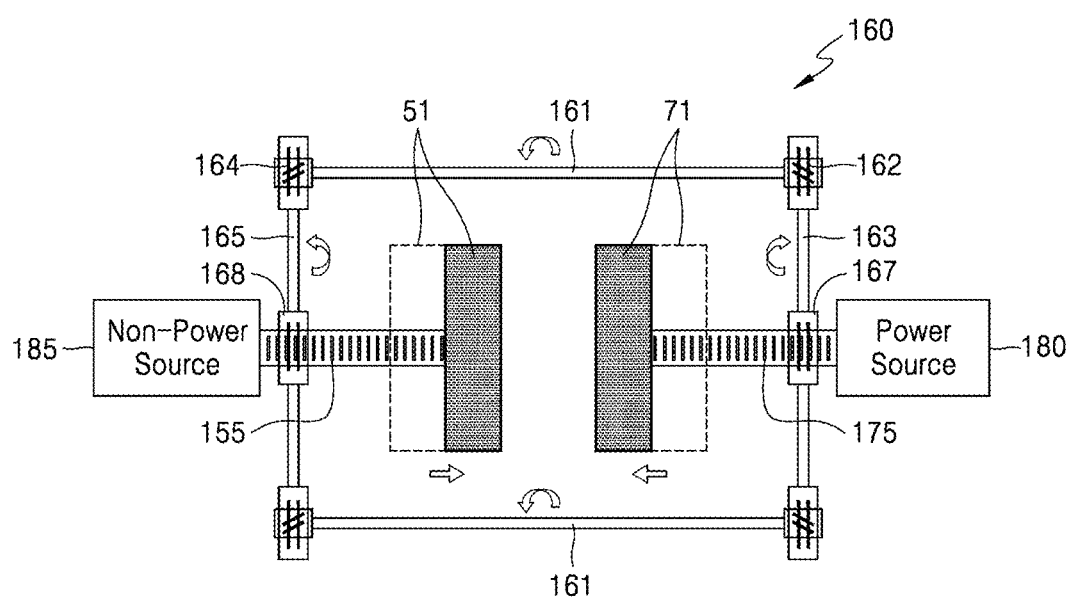
FIG. 9 shows an example of an operation of a driver of an example 3D transmon qubit apparatus, in accordance with one or more embodiments.

FIG. 9 illustrates an example of the operation of the driver of FIG. 8.

Referring to FIG. 9, when the second support rail 175 is moved towards the center by the power source 180, the first shafts 163 may rotate, for example, in a right-handed rotation direction, and due to the rotation of the first vertical gear 162 according to the rotation of the first shafts 163, the transmission shafts 161 rotate, for example, in the right-handed rotation direction, and thus, the rotation may be transmitted to the second vertical gear 164. Since the second vertical gear 164 rotates in the opposite direction to the first vertical gear 164, the second shafts 165 rotate, for example, in a left-handed rotation direction, and accordingly the first support rail 155 coupled to the sawtooth gear 168 is moved towards the center in the opposite direction to the second support rail 175, and the first superconductive metal panel 51 coupled to the first support rail 155 and the second superconductive metal panel 71 coupled to the second support rail 175 may be moved toward the center of each other to reduce the distance.

On the contrary, when the second support rail 175 is moved by the power source 180 in a direction further from the center, the first support rail 155 is also moved in the direction further from the center due to the power supplied through the connection rail structure 160. Accordingly, the first superconductive metal panel 51 coupled to the first support rail 155 and the second superconductive metal panel 71 coupled to the second support rail 175 may be moved away from the center of each other to increase the distance.

As the first and second support rails 155 and 175 are moved in a direction closer to, or further from, each other by delivering the movement of the second support rail 175, of which the location is changed by the power source, to the first support rail 155 through the connection rail structure 160 while the driver uses one power source, the distance between the first and second superconductive metal panels 51 and 71 may be adjusted in the internal space 25 of the body portion 120, and thus the effective size of the internal space of the body portion 120, that is, the 3D cavity may be adjusted, thereby tuning the resonance frequency of the 3D transmon qubit apparatus 100.

FIG. 8 and FIG. 9, illustrating the operation of FIG. 8, illustrating an example of the driver using one power source applicable to the 3D transmon qubit apparatus 100 of FIG. 6. However, the one or more examples are not limited thereto. The driver implementing one power source applicable to the 3D transmon qubit apparatus 100 according to an example may have various structures.

Figure 10A:
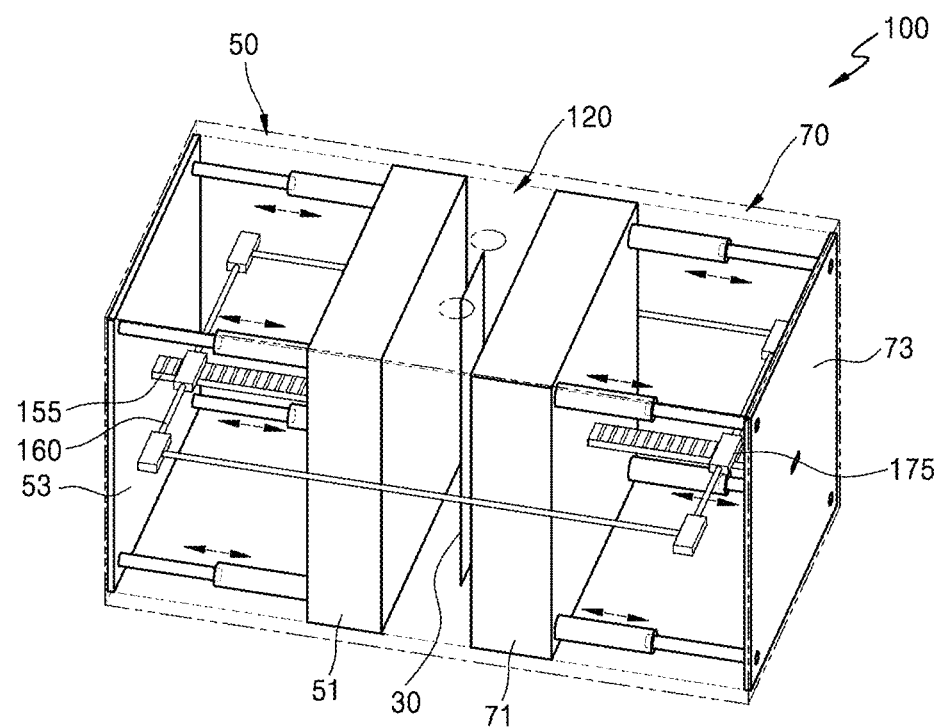
FIGS. 10A and 10B illustrate examples of an operation of a 3D transmon qubit apparatus, in accordance with one or more embodiments.
Figure 10B:
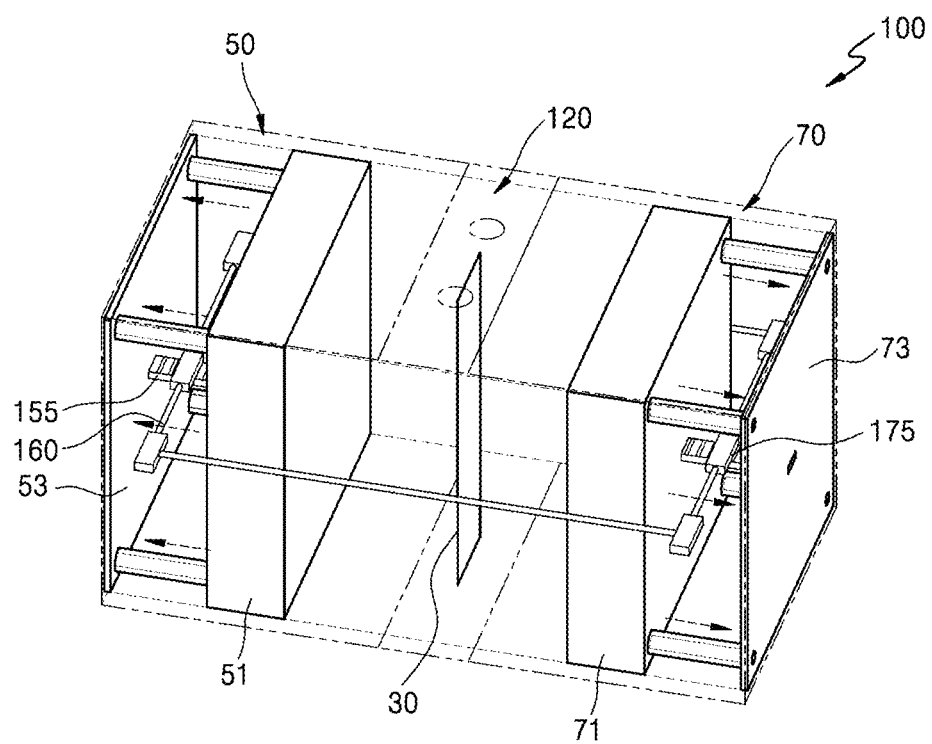

FIGS. 10A and 10B illustrate an example of the operation of the 3D transmon qubit apparatus 100 according to the example described with reference to FIG. 6. FIG. 10A illustrates a state of the transmon element 30 that is adjusted to be implemented in a close manner between the first superconductive metal panel 51 and the second superconductive metal panel 71. FIG. 10B illustrates a state of the transmon element 30 that is adjusted so that a distance between the first superconductive metal panel 51 and the second superconductive metal panel 71 is larger than the example in FIG. 10A.

Referring to FIGS. 10A and 10B, in an example, the second support rail 175 may be moved according to the power from the power source to adjust the distance between the second superconductive metal panel 71 and the second opposite panel 73, and as the first support rail 155 is moved according to the power supplied to the first support rail 155 through the connection rail structure 160, the distance between the first superconductive metal panel 51 and the first opposite panel 53 may be adjusted, thereby adjusting the distance between the first and second superconductive metal panels 51 and 71. Accordingly, a length of a resonator of the tunable cavity and an effective size of the internal space 25 of the body portion 120 may be adjusted, and thus the resonance frequency of the 3D transmon qubit apparatus 100 may be tuned.

In this example, the distance between the first superconductive metal panel 51 and the first opposite panel 53 and the distance between the second superconductive metal panel 71 and the second opposite panel 73 may be equally adjusted. As another example, the distance between the first superconductive metal panel 51 and the first opposite panel 53 and the distance between the second superconductive metal panel 71 and the second opposite panel 73 may be adjusted differently each other. The equal or different adjustment of the distance between the first superconductive metal panel 51 and the first opposite panel 53 and the distance between the second superconductive metal panel 71 and the second opposite panel 73 may be determined according to, for example, the connection rail structure 160 through which the power from the power source is transmitted. For example, the connection rail structure 160 may have a gear structure in which a location movement of the first support rail 155 according to the power from the power source is identical to a location movement of the second support rail 175. In an example, the connection rail structure 160 may have a gear structure in which the location movement of the first support rail 155 according to the power from the power source is different from that of the second support rail 175.

As described above, in the 3D transmon qubit apparatus 100 according to an example, the 3D tunable cavity and the transmon element 30 may be disposed inside the body portion 120, and the resonance frequency of the rf signals transmitted to superconductive qubits may be adjusted, thereby controlling the qubit characteristics by tuning a location and a frequency, where the resonance mode occurs. According to the 3D transmon qubit apparatus 100, for example, the size of the 3D cavity may be adjusted to enable the tuning in accordance with the Josephson coupling energy region within about 4 to 20 GHz region.

In an example, the tunable cavity and the body portions 20 and 120 may be configured to form the cavity for one transmon element 30 by holding the tunable cavity including the first tunable cavity module 50 and the second tunable cavity module 70 in the internal space 25 of the body portion 120, and a tuning range may have a value covering a frequency range of the transmon element 30, for example, covering a resonance frequency ranging from about 4 to about 20 GHz.

Figure 11A:
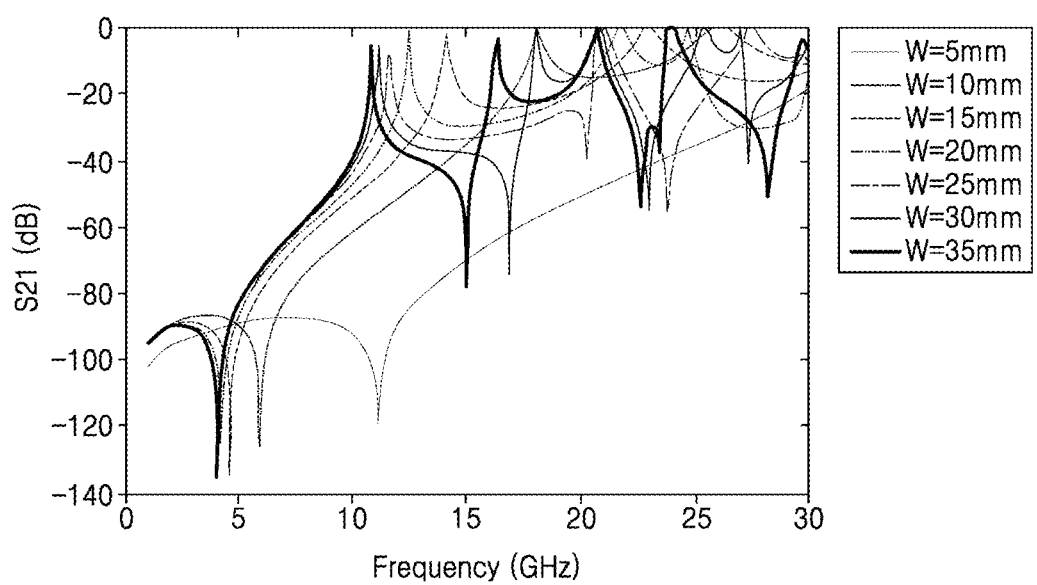
FIGS. 11A and 11B show, an example when rf signals are input and output through different ports, resonance frequency tuning according to a size adjustment of a 3D cavity of an example 3D transmon qubit apparatus, in accordance with one or more embodiments.
Figure 11B:
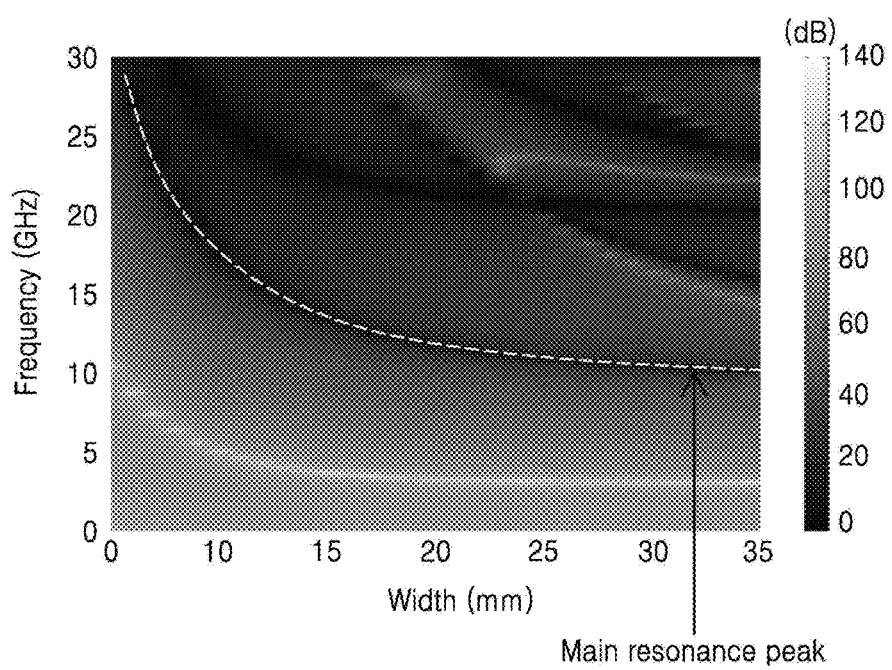

FIGS. 11A and 11B illustrate the tuning of the resonance frequency according to the size adjustment of the 3D cavity of the 3D transmon qubit apparatuses 10 and 100 when rf signals are input and output through different ports. The size adjustment of the 3D cavity may correspond to a distance W between the first and second superconductive metal panels 51 and 71. When the rf signals are input and output through different ports, the output of the rf signal may correspond to a transmission signal.

Figure 12A:
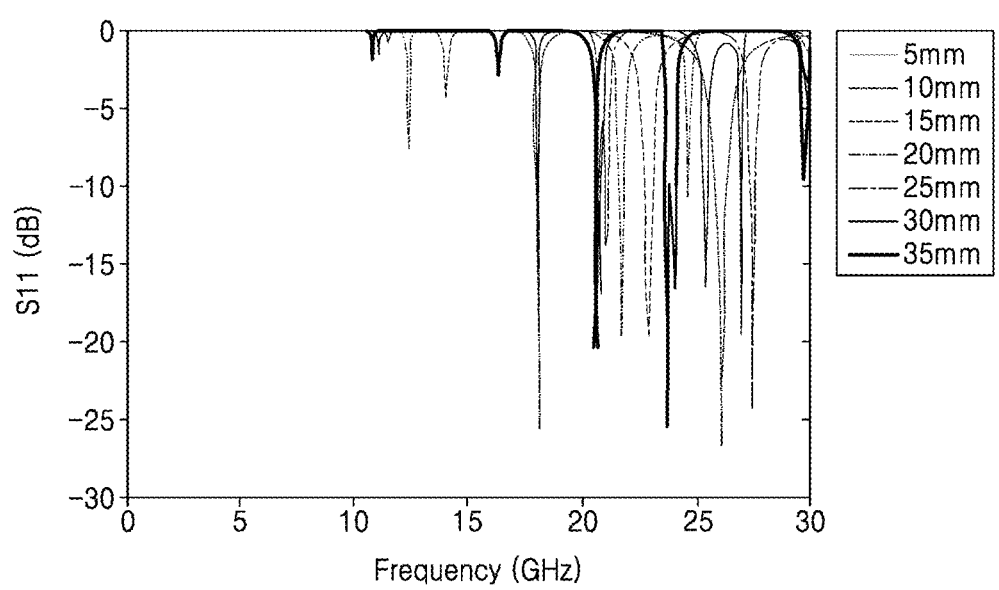
FIGS. 12A and 12B illustrate, when an input and an output of an rf signal are accepted through the same port, resonance frequency tuning according to a size adjustment of a 3D cavity of a 3D transmon qubit, in accordance with one or more embodiments.
Figure 12B:
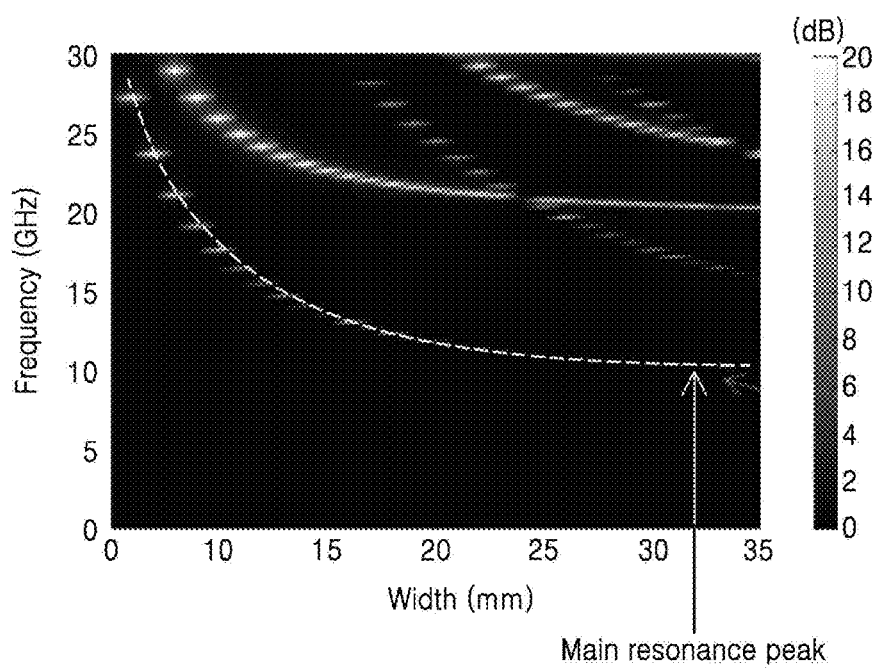

FIGS. 12A and 12*b* illustrate the tuning of a resonance frequency according to a size adjustment of the 3D cavity of the 3D transmon qubit apparatuses 10 and 100, when rf signals are input and output through the same port. The size adjustment of the 3D cavity may correspond to the distance W between the first and second superconductive metal panels 51 and 71. When the rf signals are input and output through the same port, the output of the rf signal may correspond to a reflection signal.

As illustrated in FIGS. 11A and 12A, as the size of the 3D cavity changes, a resonance frequency f0 may be shifted. Additionally, as illustrated in FIGS. 11B and 12B, a main resonance peak of the resonance frequency may change depending on the size of the 3D cavity.

In the 3D transmon qubit apparatus according to an example, the 3D cavity may be finely adjusted by applying the tunable cavity, and thus the fine control of signals for tuning superconductive qubits may be accomplished.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A three-dimensional (3D) transmon qubit apparatus comprising:
a body portion;
a driver;
a transmon element disposed in an internal space of the body portion;
a first tunable cavity module disposed in the internal space of the body, and comprising a first superconductive metal panel; and
a second tunable cavity module disposed in the internal space of the body, and comprising a second superconductive metal panel,
wherein the transmon element is disposed between the first superconductive metal panel and the second superconductive metal panel;
wherein the first tunable cavity module and the second tunable cavity module are configured to adjust a distance between the first superconductive metal panel and the second superconductive metal panel, and
wherein the driver is configured to tune a resonance frequency by adjusting a 3D cavity by adjusting the distance between the first superconductive metal panel and the second superconductive metal panel.

2. The apparatus of claim 1, wherein the first tunable cavity module comprises:
a first opposite panel connected to the first superconductive metal panel through a first sliding coupling portion,
the second tunable cavity module comprises:
a second opposite panel connected to the second superconductive metal panel through a second sliding coupling portion,
the first sliding coupling portion is configured to guide movement of the first superconductive metal panel during adjustment of a distance between the first superconductive metal panel and the first opposite panel, and
the second sliding coupling portion is configured to guide movement of the second superconductive metal panel during adjustment of a distance between the second superconductive metal panel and the second opposite panel.

3. The apparatus of claim 2, wherein each of the first and second sliding coupling portions comprises a pair of rails that are slidingly inserted into, and coupled to, each other.

4. The apparatus of claim 3, wherein the first sliding coupling portion is provided as a plurality of first sliding coupling portions, and the second sliding coupling portion is provided as a plurality of second sliding coupling portions.

5. The apparatus of claim 2, wherein the distance between the first superconductive metal panel and the first opposite panel, and the distance between the second superconductive metal panel and the second opposite panel are respectively adjusted by the driver, and
   a distance between the first superconductive metal panel and the second superconductive metal panel is adjusted.

6. The apparatus of claim 5, wherein the driver comprises:
   a first-length variable rail provided in the first tunable cavity module, and configured to adjust the distance between the first superconductive metal panel and the first opposite panel; and
   a second-length variable rail provided in second first tunable cavity module, and configured to adjust the distance between the second superconductive metal panel and the second opposite panel.

7. The apparatus of claim 6, wherein the first-length variable rail and the second-length variable rail each comprise a piezoelectric actuator, and a length of the first-length variable rail and the second-length variable rail is changed based on mechanical deformation caused by electrical energy.

8. The apparatus of claim 2, wherein the first opposite panel and the second opposite panel are respectively disposed on a first end and a second end of the body portion.

9. The apparatus of claim 2, wherein a distance between the first opposite panel and the second opposite panel is constant.

10. The apparatus of claim 1, wherein the distance between the first superconductive metal panel and the second superconductive metal panel is adjusted by a power source.

11. The apparatus of claim 10, wherein the driver comprises:
   the power source;
   a first support rail and a second support rail respectively coupled to the first superconductive metal panel and the second superconductive metal panel; and
   a connection rail structure configured to transmit power between the first support rail and the second support rail,
   wherein one of the first support rail and the second support rail is directly moved by the power source, and
   the other of the first support rail and the second support rail is moved by a power from the power source that is transmitted through the connection rail structure.

12. The apparatus of claim 11, wherein the first support rail is disposed between the power source and the first superconductive metal panel, and the first support rail is configured to move the first superconductive metal panel based on power received from the power source, and
   the second support rail is configured to move the second superconductive metal panel based on power transmitted from the power source through the connection rail structure.

13. The apparatus of claim 12, wherein the first support rail and the second support rail each comprise a sawtooth rail, and
   the connection rail structure comprises a first sawtooth gear and a second sawtooth gear respectively coupled to the sawtooth rail of the first support rail and the sawtooth rail of the second support rail.

14. The apparatus of claim 13, wherein the connection rail structure comprises:
   a first shaft that is rotatable based on a driving of the first sawtooth gear engaging with the first support rail when the first support rail is moved based on a driving of the power source;
   a second shaft that is rotatable and connected to the second sawtooth gear coupled to the sawtooth rail of the second support rail; and
   a transmission shaft having a first end coupled to a first end of the first shaft through a first vertical gear, and a second end coupled to a second end of the second shaft via a second vertical gear.

15. The apparatus of claim 14, wherein the first vertical gear and the second vertical gear each comprise crossed helical gears which rotate in opposite directions to each other.

16. The apparatus of claim 11, wherein the second support rail is located between the power source and the second superconductive metal panel, and is configured to move the second superconductive metal panel based on power received from the power source, and
   the first support rail is configured to move the first superconductive metal panel based on power transmitted from the power source through the connection rail structure.

17. The apparatus of claim 16, wherein the first support rail and the second support rail each comprise a sawtooth rail, and
   the connection rail structure comprises a first sawtooth gear and a second sawtooth gear respectively coupled to the sawtooth rail of the first support rail and the second support rail.

18. The apparatus of claim 16, wherein the connection rail structure comprises:
   a first shaft that is rotatable by driving of the second sawtooth gear engaging with the second support rail when the second support rail is moved by a driving of the power source;
   a second shaft that is rotatable and connected to the first sawtooth gear coupled to the sawtooth rail of the first support rail; and
   a transmission shaft having a first end coupled to a first end of the first shaft via a first vertical gear, and a second end coupled to a second end of the second shaft via a second vertical gear.

19. The apparatus of claim 18, wherein the first vertical gear and the second vertical gear each comprise crossed helical gears which rotate in opposite directions to each other.

20. The apparatus of claim 1, wherein the transmon element is located at a same distance from the first superconductive metal panel and the second superconductive metal panel.

* * * * *